United States Patent [19]

Neale et al.

[11] 4,225,946

[45] Sep. 30, 1980

[54] MULTILEVEL ERASE PULSE FOR AMORPHOUS MEMORY DEVICES

[75] Inventors: Ronald G. Neale, Carshalton Beeches, England; Grady M. Wood, Melbourne, FL

[73] Assignee: Harris Corporation, Melbourne, Fla.

[21] Appl. No.: 5,943

[22] Filed: Jan. 24, 1979

[51] Int. Cl.² ............................................. G11C 7/00
[52] U.S. Cl. ...................................... 365/163; 357/2
[58] Field of Search ..................... 365/163, 159; 357/2

[56] References Cited

U.S. PATENT DOCUMENTS

| | | | |
|---|---|---|---|
| 3,827,033 | 7/1974 | Quilliam | 365/163 |
| 3,846,767 | 11/1974 | Cohen | 365/163 |
| 3,875,566 | 4/1975 | Helbers | 365/163 |
| 3,886,577 | 5/1975 | Buckley | 365/163 |
| 3,922,648 | 11/1975 | Buckley | 365/163 |

FOREIGN PATENT DOCUMENTS 1372414 10/1974 United Kingdom ..................... 365/159

OTHER PUBLICATIONS

Manhart et al., Automatic 'Try and Verify' Circuit to Investigate the Reliability of Memory Switching in Amorphous Materials, Journal of Physics E.: Scientific Instruments, 1975, vol. 8, pp. 317-321.

Primary Examiner—Stuart N. Hecker
Attorney, Agent, or Firm—Leitner, Palan, Lyman, Martin & Bernstein

[57] ABSTRACT

The Write/Erase lifetimes of amorphous memory devices are extended by applying a multilevel erase pulse wherein the first stage has a current amplitude sufficient to heat the crystal filament to the phase change temperature but not to provide the energy for the phase change and erasure of the crystal structure and the second stage has a current amplitude sufficient to heat the filament to remove the crystal structure. Preferably the first stage current is equal to the write current and the second stage is equal to the write current times the ratio of the electrical conductivity of the amorphous conducting state to the apparent conductivity of the crystalline state.

22 Claims, 14 Drawing Figures

FIRST ERASE PULSE I-V CHARACTERISTIC

MULTILEVEL ERASE PULSE FOR AMORPHOUS MEMORY DEVICES

BACKGROUND OF THE INVENTION

The present invention relates generally to methods of resetting or erasing amorphous memory devices and more specifically to an improved method of resetting or erasing amorphous devices while minimizing electromigration.

Amorphous semiconductor memory devices, for example a tellurium based chalcogenide glass, are well known. These memory devices are generally bistable devices, the film of memory semiconductor material is capable of being switched from a stable high resistance condition into a stable low resistance condition when a write or set voltage pulse of relatively long duration (e.g., $\frac{1}{2}$-100 milliseconds or more) is applied. Such a set voltage pulse causes current to flow in a small filament (generally under 10 microns in diameter). The set or write current pulse generally heats regions of the semiconductor material above its glass transition and to its crystallization temperature. The consequence is that the material crystallizes around and in the region of the conducting filament. Set current pulses are commonly of a value of from 0.5 milliamperes to about 15 milliamperes, although they are generally well under 10 milliamperes for most memory applications. The magnitude of the set current pulse is determined by the open circuit amplitude of the set voltage pulse and the total series circuit resistance involved including the memory device. A crystallized low resistance filament remains indefinitely, even when the applied voltage and current are removed, until reset or erased to its initial amorphous high resistance condition.

The set crystallized filament in the semiconductor materials can generally be erased or reset by applying one or more reset current pulses of relatively short duration, such current pulses are of the order of 10 microseconds duration. The reset or erase current pulses heat the entire filament of the semiconductor material to a temperature above the crystallization and melting temperatures of the material. In this condition, the crystalline filament is melted or otherwise reformed into the original amorphous mass. When such a reset current pulse is terminated, the material quickly cools and leaves a generally amorphous composition like the original one. Sometimes, it takes a number of reset current pulses to convert a previous set filament to what appears to be a fully reset state.

While the resistance and threshold voltage values of a reset filament region may indicate it has apparently been fully reset to its original amorphous composition (except for some non-resettable crystallites which ensure that subsequent crystalline filaments are formed in the same place), the reset filament region often is non-homogeneous, with the crystallizable elements like tellurium in various degrees of concentration. This produces threshold voltage degredation when the device is stored at elevated temperatures because the materials rich in tellurium crystalize at low temperatures.

This problem has been partially overcome by feeding a number of additional reset current pulses through an apparently fully reset filament region, which further homogenizes the region, as disclosed in U.S. Pat. No. 3,846,767. This patent describes a reset procedure utilizing eight, 150 milliamperes reset current pulses spaced apart 100 microseconds. The use of such high reset current pulses to reset and homogenize the memory semiconductor material of memory devices severly limits the practical applications of memory devices in memory arrays where cost and size restrictions require high packing densities having maximum current ratings of under 50 milliamperes and sometimes under 10 milliamperes. Thus, it becomes of great importance to be able to reliably reset a memory device used in such memory arrays with reset current pulses of under 50 milliamperes, and preferably under 10 milliamperes.

These additional current pulses, while solving one problem, introduce a second. This second problem is the reduction of the write/erase lifetime on the number of write/erase cycles before the threshold voltage of the device has reduced below an acceptable level (i.e., the device fails).

This threshold degradation is caused in a germanium-tellurium memory semiconductor composition by electromigration of tellurium during the flow of reset current. The degree of which degradation is directly related to the current density involved. Such electromigration of tellurium builds up a progressively greater thickness of crystalline tellurium next to one of the electrodes involved, which progressively reduces the threshold voltage value of the memory switch device.

U.S. Pat. No. 3,875,566 discloses that amorphous devices could be erased by the use of a burst of a large number of reset current pulses each of an amplitude which was believed to be only a small fraction of the amplitude thought necessary to effect resetting of the entire filamentous path. The reset current pulses used in the practice of this resetting technique were generated by a constant current source clamped at a voltage limited to a value below the threshold voltage value of the fully reset memory device. This technique acts so as to stabilize the threshold voltage values of all the memory switch devices to which the current source was applied at identical or near identical values, despite the somewhat varying threshold voltage values of the various particular memory devices of the array. Since the threshold voltage valve of a fialment being progressively reset gradually increases with the degree of reset achieved, when the threshold voltage value of the partially reset filament of the memory device being reset exceeds the maximum possible voltage output of the constant current reset source, purposefully set below the maximum possible value thereof, the memory switch device cannot be rendered conductive by any subsequently generated reset voltage pulses, and so no further reset action is possible. It is not then possible to effect the maximum degree of rehomogenization of the filament region since under this reset procedure the device is never fully reset and does not receive reset current pulses which homogenize a fully reset filament.

U.S. Pat. No. 3,886,577 attempts to stabilize threshold voltage of a filament type memory device by providing adjacent the positive electrode a substantially enrichment of tellurium in a germanium-tellurium composition. The initial enrichment with tellurium of the area next to the positive electrode reduces the number of set and reset cycles to achieve what was thought to be a stable equilibrium of electromigration and diffusion. While an advantageous initial threshold stabilization was achieved in a few set and reset cycles, it was subsequently discovered that the threshold voltage stabilization observed did not in fact continue indefinitely.

U.S. Pat. No. 3,922,648 discloses a resetting method comprising a burst of reset current pulses at least in the neighborhood of about 10 pulses. Each pulse is substantially under 10 microseconds in duration and the pulses in each burst are spaced apart substantially under 10 microseconds, which is less than two and preferably of the order of one thermal time constant or less of the device, so that the filament region involved does not substantially completely cool to ambient temperature between reset pulses, but rather reaches a temperature intermediate the reset and ambient temperatures. The patent theorized that threshold degradation is due to an imbalance between electromigration of tellurium during flow of reset current and diffusion thereof in the other direction between reset pulses. For reset current pulses spaced apart less than than the thermal time constant of the amorphous semiconductor film involved, the filament region is still hot when the next reset pulse arrives. Consequently, an area of higher conductivity exists which results in a lower maximum current density and reduced electromigration. With such reduced electromigration, the diffusion which exists after termination of each reset pulse balances out the amount of electromigration during the flow of reset current. In such case, the initial low amplitude reset current pulses fully reset the filament path and the following low amplitude reset current pulses homogenize the filament path.

While the method of this patent minimizes current spikes from the threshold switching that occur on each erase pulse, it does not provide the most effective erase. Neither does it remove two other causes of electromigration. Namely the overdriving occurring on the first pulse of an erase sequence and the overdriving occurring from localization of current after switching, while adding the burden of maintaining precision in the timing of the erase pulse spacing. A model of a device operating according to the method of U.S. Pat. No. 3,922,648 is illustrated in FIGS. 1A, B and C. A semiconductor substrate includes a semiconductor amorphous device 10 which is illustrated in FIG. 1A as including a crystalline, ordered filament 12. Path 13 is the region where initial maximum current density is realized. On application of the reset pulse, the filament 12 is heated to above the phase change temperature and the crystals returned to the amorphous state at a melt or revitrifying temperature as illustrated in FIG. 1B as 14. As the filament 12 cools, the area 14 contracts axially and radially. This is illustrated in FIG. 1C. The cooled area is basically converted back to an amorphous material 16 having small localized crystalline 18 therein. Using the appropriately spaced pulses of the sequence of the patent, the area 14 in FIG. 1C is never allowed to disappear until the end of the sequence. Thus during the subsequent erase pulses in the sequence, area 14 expands axially and radially. As stated previously, this technique does not eliminate overdrive along a preferred path or of the whole crystal filament on the first pulse of sequence nor during the localization after switching of subsequent pulses.

Thus there exists a need of a method of resetting amorphous memory devices which minimizes electromigration addressing all three overdriving causes thereof while providing the practical advantages of low current and an independance from timing constraints.

SUMMARY OF THE INVENTION

The resetting method of the present invention minimizes electromigration to extend the write/erase lifetime of amorphous memory devices by using a multilevel erase pulse which is optimum for the total sequence of pulses and conditions of the device in a given erase sequence. The first stage of the current pulse is sufficient to heat the crystal filament to a phase change temperature and thereby remove any electrical conductivity inhomogenities on preferred electrical paths in the crystal columns. The energy supplied is insufficient to cause a phase change and start the erase process. The second stage current pulse is sufficient to provide the phase change energy to the crystal structure and to homogenize the amorphous material. Although overdrive and consequently some electromigration occurs using the two level pulse of the present invention, the amount of overdrive in the first as well as the last pulse in the sequence is minimized in an optimum manner. Preferably the first stage current amplitude is equal to the write, or set current and the second stage is preferably the set or write current times the ratio of the electrical conductivity of the amorphous high temperature conducting filament state to the apparent conductivity of the crystalline state. The first and second stages of the erase current pulse may each be square waves. A third stage having an amplitude greater than the second stage could also be added to each pulse.

An object of the present invention is to provide an erase or resetting pulse sequence which extends the write/erase lifetime of amorphous memory devices.

Another object is to provide an erase using a single multi level pulse structure which minimizes electromigration over the total erase sequence.

A further object of the invention is to use a first stage of a multistage pulse which is equal to the write current to minimize the circuitry needed to erase or reset the crystalline filament.

Still another object is to provide a reset or erase methodology which addresses the three periods of overdrive which cause electromigration.

Other objects, advantages and novel features of the invention will become apparent from the following detailed description of the invention when considered in conjunction with the accompanying drawings.

DESCRIPTION OF THE PREFERRED EMBODIMENTS

There are three main requirements of the pulse used to erase an amorphous memory device. The first is that the state and temperature of the crystallized material is changed to allow the material to return, by diffusion, to a homogeneous amorphous state. Second, a sufficient time be provided for diffusion. Thirdly, that the immediate local environment is maintained in a condition that, by quenching, allows the vitreous state to be frozen as amorphous when the erase sequence is terminated.

The optimization of the erase pulse requires that the erase be achieved with a minimization of power (current), time, increase in local temperature, electromigration effects (current density) while maximizing the probability of an erase and the permanency of the erase condition at the highest possible temperature.

The optimization of the erase using multiple pulses of the same height in sequence is compounded by the fact that during a single erase sequence, each pulse sees a slightly different device as the erase process progresses. Although sophisticated adaptive systems would provide the greatest optimization, a majority of applications would eliminate these devices because of expense and space limitations.

Figure 1A:
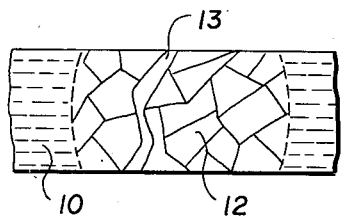
FIGS. 1A, B and C are cross-sectional views of an amorphous semiconductor material memory device illustrating the erase process of the prior art.
Figure 1B:
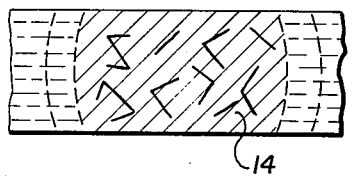
Figure 1C:
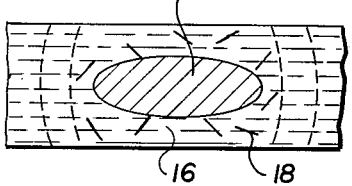
Figure 2A:
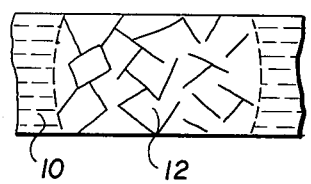
FIGS. 2A, B and C are cross-sectional views of an amorphous semiconductor material memory device illustrating the erase process of the present invention by the first erase pulse of an erase sequence.
Figure 2B:
Figure 2C:
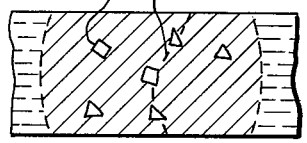

The memory device prior to an erase pulse is illustrated in FIG. 2. FIG. 2A consists of a column of crystallites 12 all touching and surrounded by an annulus of amorphous material 10. The initial action of the erase pulse is to raise the temperature of the crystallites to the phase change temperature of the material and then supply sufficient energy for the phase change to take place. As illustrated in FIG. 2B a hot column 14 is initially formed in the crystallite 12 and expands radially to the radius of the original crystallite area 12 and beyond. Upon quenching the erase pulse, the crystallite material 12 remains vitreous leaving an amorphous area 16 of approximately the same radius as the original crystallite of area 12 and can include a plurality of localized, nontouching crystallites 18 therein. This condition is illustrated in FIG. 2C. Also illustrated therein is a dotted line 20 illustrating a conductor path between nontouching crystallites which is the source of initial conduction during subsequent erase pulses in the erase sequence.

Figure 3:
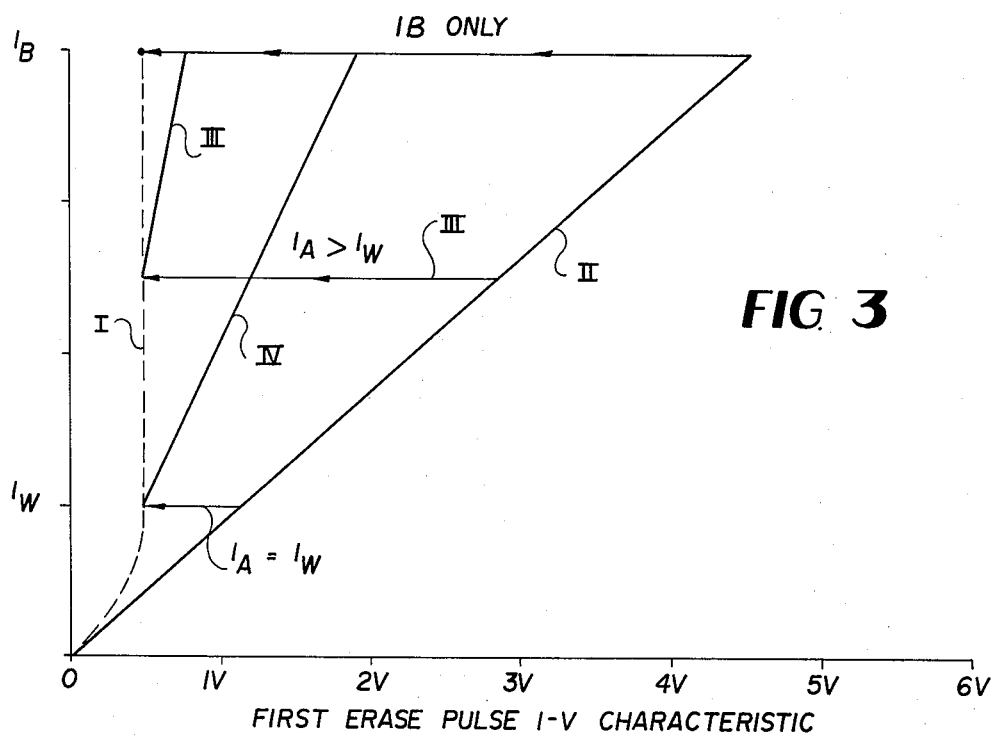
FIG. 3 is a graph of a plurality of voltage-current curves for a first erase pulse of three different pulse configurations.

The leading edge action is best viewed by considering an ideal constant current source affixed to the amorphous memory device. As illustrated in the graph of FIG. 3, the DC or slow ramp chracteristics of the memory conducting state, clearly shows the nonlinear affect illustrated as curve I. The initial part of the characteric are ohmic and if heating is not allowed (for example by the use of a fast pulse) the current increases linearly with voltage. The first pulse of an erase sequence causes the voltage across the device to instantaneously rise to the product of the erase pulse and the ohmic resistance. The dissipation of power raises the temperature of the device and when the phase change temperature is reached, it provides the energy for the phase change. Thus an erase pulse must have sufficient power to change the phase of the crystallites and produce in the material a state much like the post switching conducting filament observed in a write or set sequence. Once this condition has been achieved, it is now necessary to provide the current to maintain the phase change temperature for a sufficient time or period to diffuse the inhomogenities to create a homogeneous amorphous material. Since electromigration occurs during the overdrive condition, namely wherein the power is greater than that which the expansion of the hot filament can absorb, the present invention provides an optimization to minimize overdrive.

Generally it is preferred to use a current pulse containing sufficient power to insure the resetting of the extreme case (the largest crystal filament radius). Thus some form of overdrive must be present. The overdrive condition is maintained while the filament expands to accomodate the additional current. During this period, the temperature of the core region will rise and electromigration is actively present.

Figure 4:
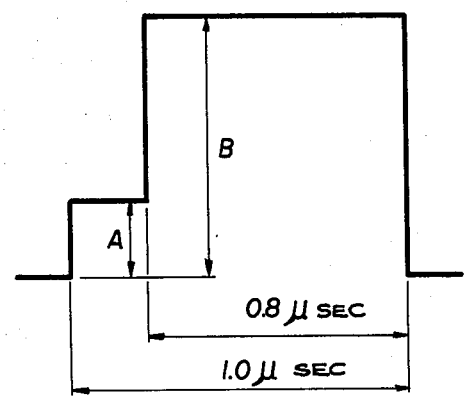
FIG. 4 is a graph of a bilevel current pulse incorporating the principles of the present invention.

FIG. 3 also indicates the voltage-current curve of the amorphous device in the crystalline condition using a standard erase pulse having a magnitude of approximately five times the write or set pulse. This is curve II and has a current of $I_B$. The time when significant electromigration occurs is indicated by the horizontal portion or dotted line of the curve from the top edge to the steady state curve I. FIG. 4 illustrates a multilevel erase pulse of the present invention having a prepulse or first stage or portion A and a second stage or portion B. The first portion A has a relatively short period while the second portion B has a relatively long period. For example, the amplitude of stage portion A is preferably the write current having amplitude of 1 to 10 milliamperes for a period of 100 to 200 nanoseconds although it may be for a period of 40 to 300 nanoseconds. The amplitude of portion B is approximately 15 to 30 milliamperes and a duration of 500 to 1000 nanoseconds. Curve III represents an example wherein the first stage A ha an amplitude of, for example one-half the standard erase amplitude B. Note that the horizontal portions of the curve, which represent the overdrive for the period of electromigration, are smaller than that portion for using no prepulse. The preferred embodiment is illustrated by curve IV wherein the prepulse has an amplitude of $I_W$ and a second portion represented by the amplitude $I_B$ of a normal erase pulse. As can be seen this produces a substantially smaller amount of overdrive than the previous two curves. It should be noted that $I_W$ is considered the lowest possible prepulse amplitude for the first stage A since the prepulse must have sufficient power to bring the crystallite to the phase change temperature and the crystallite column to constant electrical conductivity.

Figure 5A:
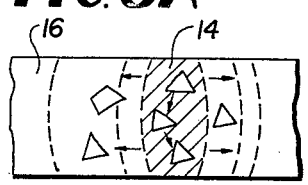
FIGS. 5 A, B and C are cross-sectional views of an amorphous semiconductor material memory device illustrating the erase process by subsequent erase pulses of an erase sequence.
Figure 5B:
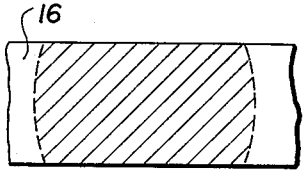

Within two or three pulses, sufficient erase will have occured to separate the remaining crystallites by amorphous material and subsequent reset pulses will necessitate switching this amorphous material before a significant current can flow. Switching in the conventional manner will initially cause the current to flow down the path of lowest breakdown voltage and thus an embryo hot filament will be driven both by the constant current source plus the capacitive discharge current resulting from the switching transients. This occurs until the filament has expanded to the equilibrium condition. FIG. 5A illustrates this phenomenon wherein the hot embryo filament 14 is formed in the substantially amorphous material 16 and it expands to the extremeties of the amorphous material 16 as illustrated in FIG. 5B. Upon quenching by termination of the erase pulse, the material cools to an almost completely amorphous material 16.

Figure 5C:
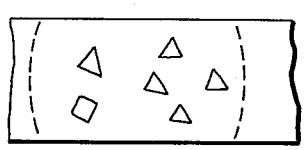
Figure 6:
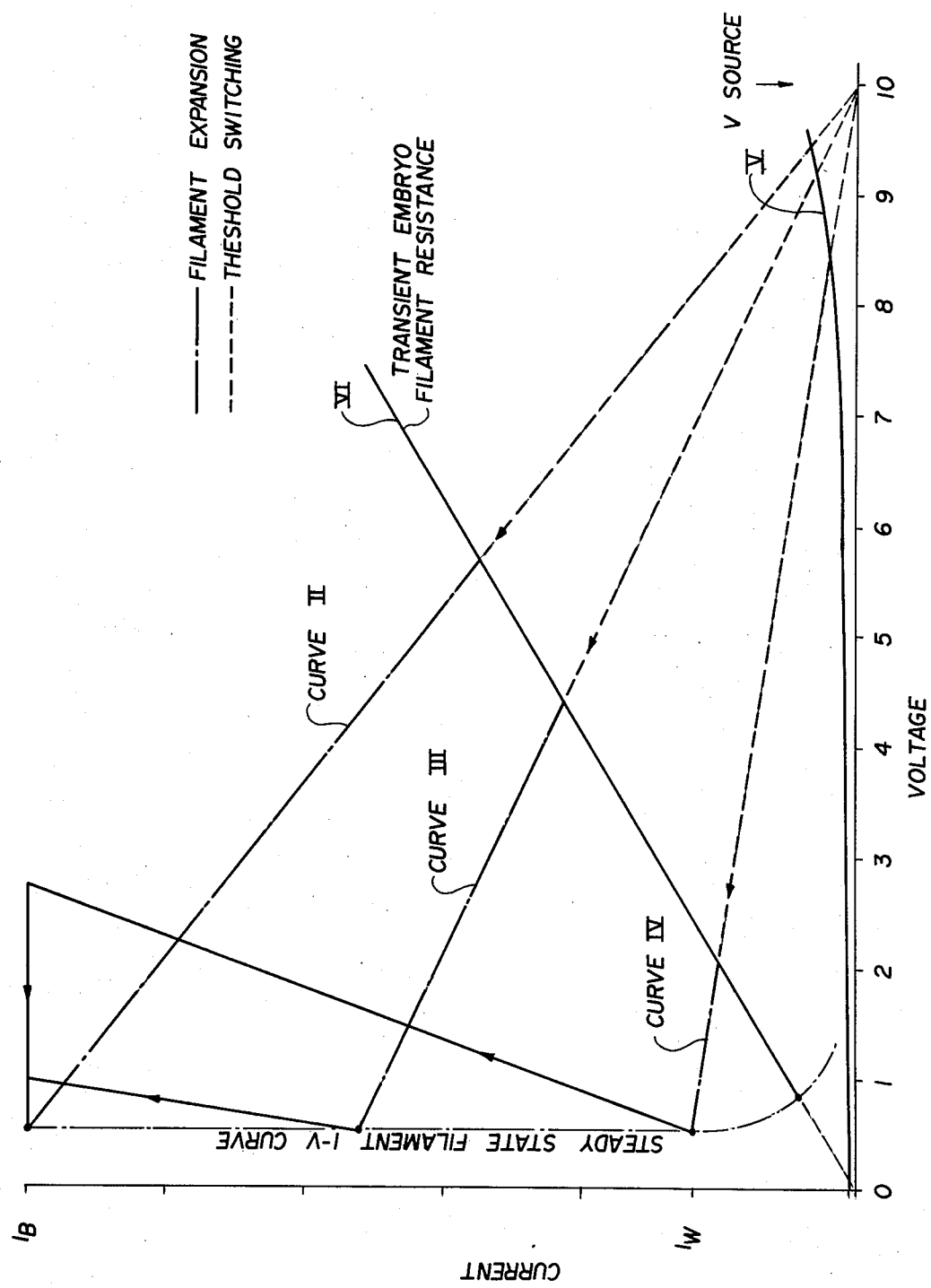
FIG. 6 is a graph of a plurality of voltage-current curves for subsequent erase pulses of the three pulse shapes of FIG. 3.

FIG. 6 illustrates the voltage-current characteristics for the N+10 erase pulse of the pulses discussed for FIG. 3. In this later condition of erase each pulse traverses curve V until switching occurs. Curve I is then reached through a region of unstable negative resistance. Line VI represents the resistance of the transient embryo filament. The portion of the curves between curve V and line VI represents the threshold switching. The subsequent portion of curves II, III and IV represents the period of filament expansion. The present invention by reducing the period of filament expansion thereby reduces the probability of overdrive and consequently reduces electromigration. As illustrated in FIG. 5, the small embryo hot filament 14 develops and the constant source tries to force the erase current in that filament and overdrives it. The overdrive occurs during and after the second portion of the negative resistance curves of FIG. 6. The initial part of the switching transients occurs in 200 picoseconds and therefore the overdrive is essentially proportional to current. The duration of the prepulse amplitude A allows filament equal to the original write filament to be established and then expand to the size required for the erase pulse by the second pulse of the amplitude B. As discussed previously, the prepulse of pulse amplitude A can only be reduced to $I_W$ the write current.

Figure 7:
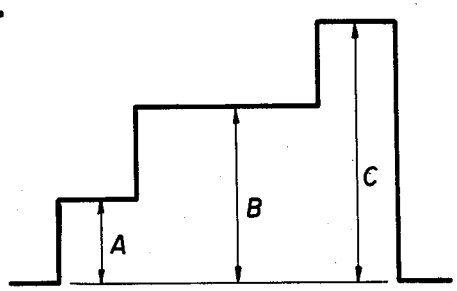
FIG. 7 is a graph of a trilevel current pulse incorporating the principles of the present invention.

FIG. 7 illustrates another pulse for use in the sequence including the prepulse A, an erase pulse B and a further erase pulse C. The amplitude of C is greater than B yet having a shorter duration. For example A may have an amplitude of $I_W$, B may have an amplitude of a normal erase and C may be twice the normal erase amplitude. This is useful when large erase current amplitudes are utilized.

Since the preferred embodiment selects the amplitude of the prepulses being $I_W$, the circuitry is already available to provide a substantially constant current source of I write and erase. Preferably the ratio of the prepulse amplitude to the second stage or subsequent pulse amplitude is equal to the ratio of the conductivity of the crystalline state to the conductivity of the amorphous state in a conducting filament. This relationship by defining a minimum erase current relative to the write current will reduce overdrive and consequently electromigration during the second stage of the pulse.

a germanium-tellurium amorphous material memory device was built and tested. The write/erase lifetime of a device operating with a 30 milliamperes single amplitude reset pulse train, was compared with that of a device operated using a 6 milliamperes prepulse and a 30 milliamperes second stage pulse. The useful life of the device was more than doubled.

Thus it can be seen that overdrive during the total erase sequence can be optimized to minimize electromigration by using a two level erase pulse. The levels and shapes of the pulses may vary as long as the prepulse is sufficient to bring the crystalline material to the phase change temperature and the subsequent pulse is of sufficient amplitude and duration to produce complete phase change and rehomogenization of the previously crystallized material to an amorphous material.

The use of a slow ramp in mimizing overdrive, and the resulting electromigration is prohibited because of the necessity to provide energy at some minimum rate to support both the energy required for the phase change (order-disorder) and that lost by conduction to the electrodes and an expanding filamentary conducting region around the crystal column.

Figure 8:
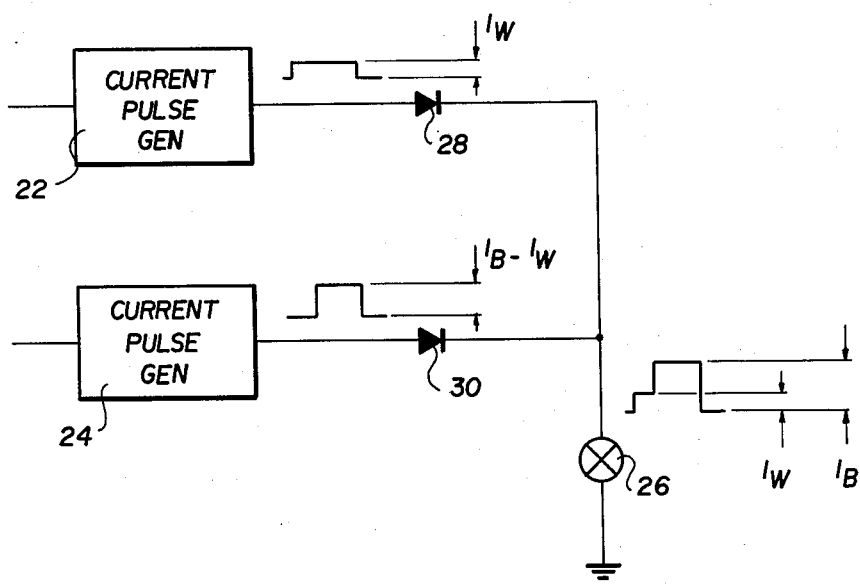
FIG. 8 is a block diagram of a circuit for producing the erase currents.

FIG. 8 illustrates a circuit capable of producing the multilevel pulse of the present invention. Current pulse generators 22 and 24 are connected in parallel to an amorphous device 26 through diodes 28 and 30 respectively. Generator 22 produces a current pulse having an amplitude of $I_W$ (the write or set current) and generator 24 a current pulse having an amplitude of $I_B-I_W$ (the erase current minus the write current). The duration of $I_W$ is equal to the duration of the total pulse of FIG. 4, for example one microsecond. The duration of $I_B-I_W$ is equal to the duration of the B stage of the pulse of FIG. 4, for example 800 nanoseconds and delayed from the beginning of $I_W$ so that the pulses for generator 22 and 24 end at the same time. The resulting combined pulse is that of FIG. 4.

In the preceding description of the preferred embodiment, it is evident that the objects of the invention are attained. Although the invention has been illustrated in detail, it is to be clearly understood the same is by way of illustration and example only and is not to be taken by way of limitation. The spirit and scope of this invention being limited only by the terms of the appended claims.

What is claimed is:

1. A method of resetting a filament-type memory device including spaced electrodes between which extend a body of generally amorphous substantially non-conductive memory semiconductor material which, when a set voltage pulse in excess of a given threshold voltage value and duration is applied to said electrodes, has formed therein a crystalline low resistance filamentous path resettable into a generally amorphous condition by application of one or more voltage pulses producing reset current pulses through said filamentous path which heat the same to a temperature which changes the phase of the crystalline filament and are of a duration which is so short that upon termination of each reset current pulse the filamentous path will be quickly quenched to leave at least portions of the filamentous path in a substantially amorphous condition, said method comprising: applying to said electrodes a plurality of reset voltage pulses which produce a plurality of reset current pulses each having a first stage amplitude and duration sufficient to heat the filament to the phase change temperature of the material and a second stage amplitude and duration larger than said first stages and sufficient to change the phase of the crystal structure.

2. The method of claim 1 wherein said first stage amplitude is at least the amplitude of a set current produced by said set or write voltage pulse.

3. The method of claim 2 wherein said first stage is applied for a duration in the range of 40 to 300 nanoseconds.

4. The method of claim 2 wherein said first stage amplitude is no greater than one half said second stage amplitude.

5. The method of claim 4 wherein said second stage is applied for a duration in the range of 500 to 1,000 nanoseconds.

6. The method of claim 1 wherein the ratio of the first stage amplitude to the second stage amplitude is equal to the ratio of the conductivity of the crystalline state to the electrical conductivity of the amorphous conducting filament state.

7. The method of claim 1 wherein said first and second stages are square waves, the second stage instantaneously following the first stage.

8. The method of claim 7 wherein said reset current pulse includes a third stage having an amplitude greater than said second stage amplitude.

9. The method of claim 1 wherein said first stage has an amplitude and duration insufficient to change the phase of the crystal structure.

10. A method of resetting a filament-type memory device including spaced electrodes between which extend a body of generally amorphous substantially nonconductive memory semiconductor material which, when a set voltage pulse in excess of a given threshold voltage value and duration is applied to said electrodes, has formed therein a crystalline low resistance filamentous path resettable into a generally amorphous condition by application of one or more reset voltage pulses producing reset current pulses through said filamentous path which heat the same to a temperature which changes the phase of the crystalline filament and are of a duration which is so short that upon termination of each reset current pulse the filamentous path will be quickly quenched to leave at least portions of the filamentous path in a substantially amorphous condition, said method comprising: applying to said electrodes a plurality of reset voltage pulses which produce a plurality of reset current pulses, each current pulse having a first stage and a second stage, said first stage having sufficient amplitude and duration to heat the filament to the phase change temperature of the material during an initial plurality of reset pulses while minimizing filament overdrive during a subsequent plurality of reset pulses when the filament switches states, and said second stage having sufficient amplitude and duration to produce a substantial complete phase change of said material from crystalline to amorphous during said reset pulses.

11. The method of claim 10 wherein said first stage amplitude is at least the amplitude of a set current produced by said set voltage pulse.

12. The method of claim 10 wherein the ratio of the first stage amplitude to the second stage amplitude is equal to the ratio of the conductivity of the crystalline state to the electrical conductivity of the amorphous conducting filament state.

13. The method of claim 10 wherein said first stage has an amplitude and duration insufficient to change the phase of the crystal structure.

14. In a circuit having a filament-type memory device including spaced electrodes between which extend a body of generally amorphous substantially nonconductive memory semiconductor material which, when a set voltage pulse in excess of a given threshold voltage value and duration is applied to said electrodes has formed therein, a crystalline low resistance filamentous path resettable into a generally amorphous condition by application of one or more reset voltage pulses producing reset current pulses through said filamentous path which heat the same to a temperature which changes the phase of the crystalline filament and are of a duration which is so short that upon termination of each reset current pulse the filamentous path will be quickly quenched to leave at least portions of the filamentous path in a substantially amorphous condition; and means selectively connectable to said electrodes for applying reset voltage pulse or pulses which produces a reset current pulse or pulses which substantially completely convert the crystalline filamentous path to a substantially amorphous filamentous path, the improvement comprising said means applying reset voltage pulse or pulses which produces a reset current pulse having a first stage amplitude sufficient to heat the filament to the phase change temperature of the material and a second stage amplitude larger than said first stage amplitude and sufficient to heat the filament to change the phase of the crystal structure.

15. The circuitry of claim 14 wherein a said first stage amplitude is at least the amplitude of a set current produced by said set voltage pulse.

16. The circuit of claim 15 wherein said first stage is applied for a duration in the range of 40 to 300 nanoseconds.

17. The circuit of claim 15 wherein said first stage amplitude is no greater than one half said second stage amplitude.

18. The circuit of claim 17 wherein said second stage is applied for a duration in the range of 500 to 1,000 nanoseconds.

19. The circuit of claim 14 wherein the ratio of the first stage amplitude to the second stage is equal to the ratio of the conductivity of the crystalline state to the conductivity of the amorphous conducting filament state.

20. The circuit of claim 14 wherein said first and second stages are square waves, the second stage instantaneously following the first stage.

21. The circuit of claim 20 wherein said reset current pulse includes a third stage having an amplitude greater than said second stage amplitude.

22. The circuit of claim 14 wherein said first stage has an amplitude and duration insufficient to change the phase of the crystal structure.

* * * * *

UNITED STATES PATENT AND TRADEMARK OFFICE
CERTIFICATE OF CORRECTION

PATENT NO. : 4,225,946

DATED : September 30, 1980

INVENTOR(S) : Ronald G. Neale, et al

It is certified that error appears in the above-identified patent and that said Letters Patent are hereby corrected as shown below:

Column 1, line 59, delete "degredation" and insert

-- degradation --

Column 2, line 2, delete "severly" and insert -- severely --

Column 2, line 42, delete "fialment" and insert -- filament --

Column 6, line 15, delete "accomodate" and insert

-- accommodate --

Column 6, line 37, delete "ha" and insert -- has --

Column 6, line 53, delete "occured" and insert -- occurred --

Column 6, line 66, delete "extremeties" and insert

-- extremities --

Column 7, line 48, delete "a" at beginning of sentence and insert -- A --

UNITED STATES PATENT AND TRADEMARK OFFICE
CERTIFICATE OF CORRECTION

PATENT NO. : 4,225,946
DATED : September 30, 1980
INVENTOR(S) : Ronald G. Neale, et al It is certified that error appears in the above-identified patent and that said Letters Patent are hereby corrected as shown below:

Column 7, line 64, delete "mimizing" and insert

-- minimizing --

In Claim 19, line 39, after the words "second stage" insert

-- amplitude --

Signed and Sealed this

Twenty-third Day of December 1980

[SEAL]

Attest:

SIDNEY A. DIAMOND

Attesting Officer

Commissioner of Patents and Trademarks